United States Patent [19]

Hong et al.

[11] Patent Number: 5,304,864
[45] Date of Patent: Apr. 19, 1994

[54] ANALOG MAXIMUM/MINIMUM SELECTOR CIRCUIT

[75] Inventors: John H. Hong, Moorpark; Nan-Lei Wang, Thousand Oaks, both of Calif.

[73] Assignee: Rockwell International Corporation, Seal Beach, Calif.

[21] Appl. No.: 927,899

[22] Filed: Aug. 7, 1992

[51] Int. Cl.$^5$ .................. H03K 5/153; H03K 5/22
[52] U.S. Cl. .................... 307/351; 307/355
[58] Field of Search ............ 307/351, 355, 356, 357

[56] References Cited

U.S. PATENT DOCUMENTS

| | | | |
|---|---|---|---|
| 4,101,763 | 7/1978 | Flint et al. | 307/351 |
| 4,446,486 | 5/1984 | Itoh | 307/351 |
| 4,539,495 | 9/1985 | Demler | 307/355 |
| 4,564,281 | 1/1986 | Takemae et al. | 307/357 |
| 4,704,546 | 11/1987 | Mallick, Jr. et al. | 307/357 |
| 5,003,196 | 3/1991 | Kawaguchi | 307/356 |
| 5,038,055 | 8/1991 | Kinoshita | 307/351 |
| 5,047,667 | 9/1991 | Howie | 307/351 |
| 5,075,567 | 12/1991 | Kubota | 307/355 |
| 5,159,211 | 10/1992 | Fujii | 307/351 |

OTHER PUBLICATIONS

K. Wagner and T. Slagle, "Competitive Optical Learning with Winner–Take–All Modulators," OSA Topical Meeting on Optical Computing, Salt Lake City, Mar. 4–6, 1991, OSA Tech. Digest Series, vol. 6, pp. 280–283.

Primary Examiner—E. Rollins Cross
Assistant Examiner—Thomas Moulis
Attorney, Agent, or Firm—John C. McFarren

[57] ABSTRACT

An electronic circuit is provided for comparing a plurality of input signals and indicating and/or selecting the maximum or minimum signal from the input set. The plurality of input signals are amplified, logarithmically compressed, and buffered by a corresponding plurality of simple transistor circuits, which are substantially identical. The buffered input signals are provided to a high resolution multiple input comparator circuit. The comparator circuit comprises a two-stage emitter-coupled comparator and a single stage inverter-amplifier. In the first comparator stage, strong input signals share the bias current but all the weak signals drop out. The inverter-amplifier stage amplifies the differences between the strong signals that survive the first comparison stage. The second stage comparator determines the strongest of the few remaining signals. With fewer competing signals, and enlarged voltage differences between them, the second stage comparator can determine the strongest of the original input signals with a high degree of resolution.

19 Claims, 2 Drawing Sheets

ANALOG MAXIMUM/MINIMUM SELECTOR CIRCUIT

TECHNICAL FIELD

The present invention relates to analog detector circuits and, in particular, to an electronic circuit for indicating or selecting a maximum or minimum from a distribution of input signals.

BACKGROUND OF THE INVENTION

A useful function for detector circuits is the indication or selection of a maximum or minimum value from an input comprising a multiplicity of electrical signals or optical intensity values, such as from a detector array, for example. A commonly used processing technique for determining maximum/minimum values is digitization of the input signal distribution set followed by digital comparison of the elements of the set. An alternative method involves complicated analog feedback circuitry for suppressing non-extreme values of the input set. Because these prior art techniques require complex circuits for manipulating elements of the input set, a simple, straight-forward, analog method has been sought for indicating and/or selecting the maximum or minimum value from a set of input signals.

SUMMARY OF THE INVENTION

The present invention comprises an electronic circuit that compares a plurality of input signals and indicates and/or selects the maximum or minimum signal from the input set. The input signals provided to the comparator circuit may be electronic, optoelectronic, photonic, or acoustic. The plurality of input signals are amplified, compressed, and buffered by a corresponding plurality of simple transistor circuits, which are substantially identical, having carefully matched components. The buffered input signals are provided to a high resolution multiple input comparator circuit.

The preferred embodiment of the comparator circuit comprises a two-stage emitter-coupled comparator and a single stage inverter-amplifier. In the first comparator stage, strong input signals share the bias current but all the weak signals drop out. The inverter-amplifier stage amplifies the differences between the strong signals that survived the first comparison stage. The second stage comparator determines the strongest of the few remaining signals. With fewer competing signals, and enlarged voltage differences between them, the second stage comparator can determine the strongest of the original input signals with a high degree of resolution.

A principal object of the invention is the indication or selection of a maximum or minimum from a plurality of input signals. A feature of the invention is a high resolution, multiple input comparator circuit. An advantage of the invention is a simple, analog circuit for selecting the maximum or minimum from a plurality of input signals.

BRIEF DESCRIPTION OF THE DRAWINGS

For a more complete understanding of the present invention and for further advantages thereof, the following Detailed Description of the Preferred Embodiment makes reference to the accompanying Drawings, in which.

DETAILED DESCRIPTION OF THE PREFERRED EMBODIMENT

Figure 2:
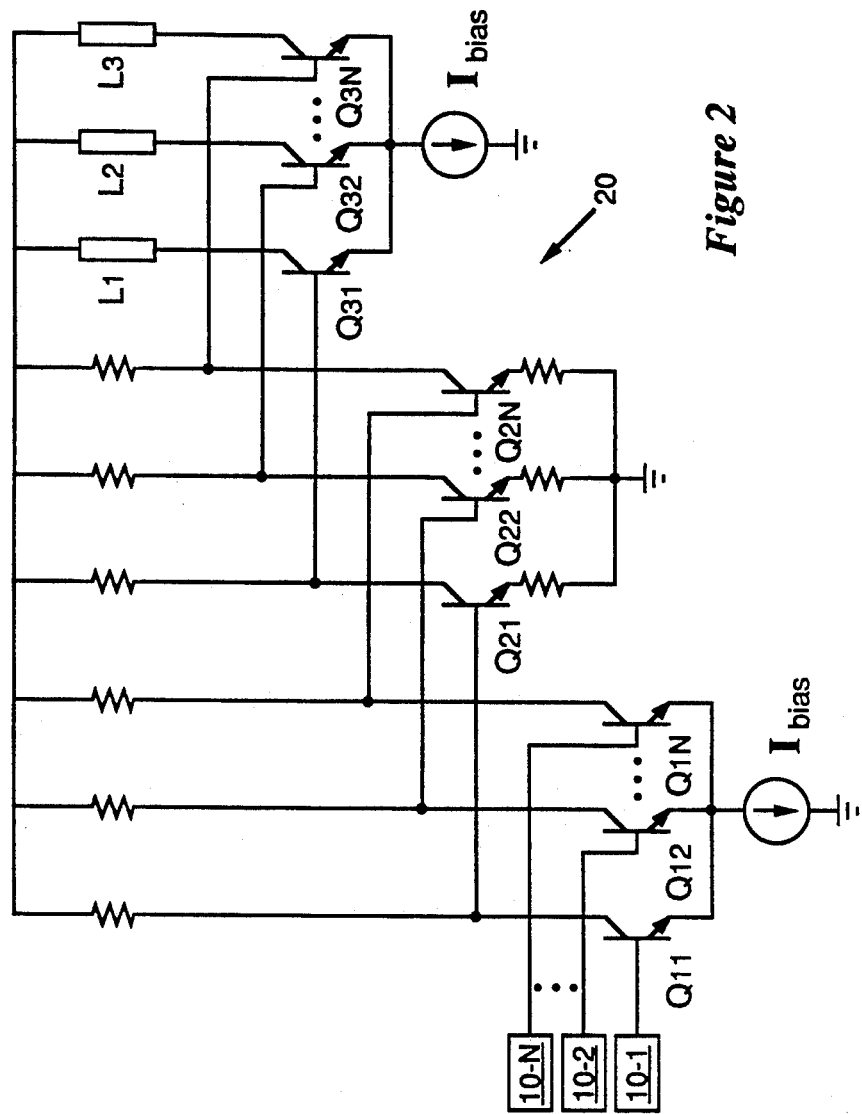
FIG. 2 is a schematic circuit diagram of a multiple input comparator circuit of the present invention.
Figure 1:
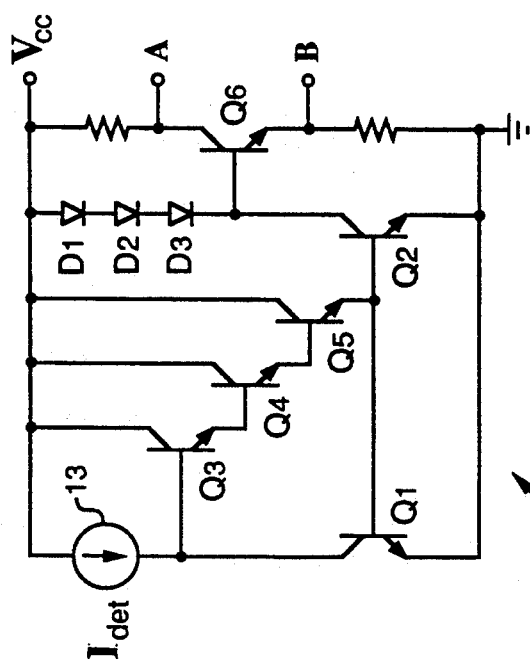
FIG. 1 is a schematic circuit diagram of a logarithmic current amplification and buffer circuit of the present invention.

An optoelectronic embodiment of the basic indicator/selector circuit of the present invention is illustrated in FIGS. 1 and 2. FIG. 1 illustrates a logarithmic amplifier and buffer circuit 10 for a current source such as photodetector 13. FIG. 2 illustrates a multiple input comparator 20 of the present invention. Comparator 20 receives inputs from a plurality of amplifier/buffer circuits 10 for detecting, indicating, and/or selecting the input signal that has the maximum or minimum intensity, as from a plurality of photodectors 13, for example.

As shown in FIG. 1, circuit 10 includes a current source, such as photodetector 13, that provides an input signal to comparator 20. The current source provides an input signal from any type of electrical circuit or sensing device. Transistors Q1 through Q5 form a high-gain amplifier. The multiplication factor of circuit 10 is the ratio of size of transistors Q1 and Q2. To keep the base current of transistor Q3 much less than the minimum of $I_{det}$, one or more transistors, such as transistors Q3 through Q5, may be laddered as illustrated in FIG. 1. The number and sizes of transistors Q3 through Q5 are determined by the current gain and the multiplication factor of circuit 10. Transistors Q3 through Q5 must provide enough composite gain for the minimum collector current of transistor Q2 to be much greater then the base current of transistor Q6.

The amplified detector current $I_{det}$ is translated to a voltage by means of a diode or series of diodes D1 through D3. Diodes D1 through D3 must be large enough in area to avoid a series resistance effect. Because the diodes produce a voltage that is proportional to the log of the current, the voltage at the base of transistor Q6 may be stated as:

$$V_{bQ6} = V_{cc} - V_o \log I_{cQ2} = V_{cc} - V_o' \log I_{det}.$$

The logarithmic relationship allows a broad dynamic range (e.g., several orders of magnitude) of the input signal $I_{det}$ to be compressed to a more reasonable range for comparator circuit 20.

Transistor Q6 forms a buffer amplifier for connecting the detector circuit 10 to comparator circuit 20 of FIG. 2. The buffer amplifier provides two output nodes, A and B, for connection to comparator circuit 20. Node A is high in voltage when $I_{det}$ is high and node B is high when $I_{det}$ is low. Because comparator circuit 20 is a "high voltage takes all" type of circuit, node A is connected to circuit 20 for detecting a maximum (i.e.,high $I_{det}$ takes all) and node B is connected to circuit 20 for detecting a minimum (i.e. low $I_{det}$ takes all). Therefore, it can be seen that a plurality of circuits 10, such as circuits 10-1, 10-2 . . . 10-N, may be connected to multiple input comparator 20 by means of switches (not shown) that can be set for circuit 20 to detect either the maximum or the minimum from the set of input signals $I_{det}$.

The preferred embodiment of comparator circuit 20 comprises three stages. If a single stage comparator comprising emitter-coupled pairs is expanded from two inputs to multiple inputs, it suffers from poor resolution because the highest input voltage signal must be much greater than the second highest signal for it to take all of the bias current $I_{bias}$. Comparator circuit 20 of the present invention overcomes this resolution problem by providing two emitter-coupled comparator stages and one inverter-amplifier stage.

The first stage of comparator 20 comprises a plurality of transistors Q11, Q12 ... Q1N that receive a corresponding plurality of input signals. As stated above, the input signals may be provided by a corresponding plurality of essentially identical logarithmic buffer-amplifier circuits 10-1, 10-2 ... 10-N. Of the N signals input to the first comparator stage Q11, Q12 ... Q1N, only the strongest signals turn on their corresponding transistors and share a portion of the bias current $I_{bias}$. The strong signals surviving the first stage are provided to inverter-amplifiers Q21, Q22 ... Q2N, where they result in high collector voltages on transistors Q21, Q22 ... Q2N. The inverter-amplifier functions to amplify the differences between the strengths of the signals that survived the first stage comparator to provide a much higher resolution in determining the strongest of the input signals.

The amplified signals from the inverter-amplifier stage are provided to the second comparator stage comprising transistors Q31, Q32 ... Q3N. Because the differences in intensity of the surviving signals are amplified by the inverter-amplifier stage, the strongest signal turns on its one of the Q31, Q32 ... Q3N transistors, thereby drawing essentially all of the bias current $I_{bias}$ and suppressing the remaining transistors. As a result, the one load of Loads 1 ... N that is connected to the one transistor that is turned on provides an indication or selection of the strongest signal originally input to comparator circuit 20. Loads 1 ... N may comprise LEDs, digital readouts, monitors, or any other type of indicator/selector circuits.

The combination of circuits 10 and 20 of FIGS. 1 and 2 provides a high dynamic range, high resolution, "winner takes all" circuit. Detection-logarithmic-buffer circuits 10 compress the input signals $I_{det}$ having several orders of magnitude into a small range in voltage at node A or B. Comparator circuit 20, having two comparator stages separated by an inverter-amplifier stage, can distinguish small differences in the input voltage from node A or B of circuit 10. This translates into a high resolution in determining the maximum or minimum intensity from among the plurality of input signals $I_{det}$.

In the preferred embodiment of the invention, the circuits are fabricated using diodes and npn bipolar transistors. The invention can use pnp bipolar transistors without departing from the scope of the invention. With pnp bipolar transistors, the Q21–Q2N and Q31–Q3N stages could be combined into a single multiple input emitter-coupled group comparator. MOSFET technology can be used only to a limited extent because of the limited dynamic range of current in MOSFETs. Therefore, MOSFETs cannot be used in the current amplification circuit but can replace bipolar transistors in the comparator circuit. Furthermore, comparator circuit 20 is not limited to the stages illustrated in FIG. 2. For greater resolution, additional comparator stages can be added as necessary. Likewise, other schemes to derive the log of the input current in circuit 10 can be derived by those having skill in the art without departing from the scope of the invention.

Figure 3:
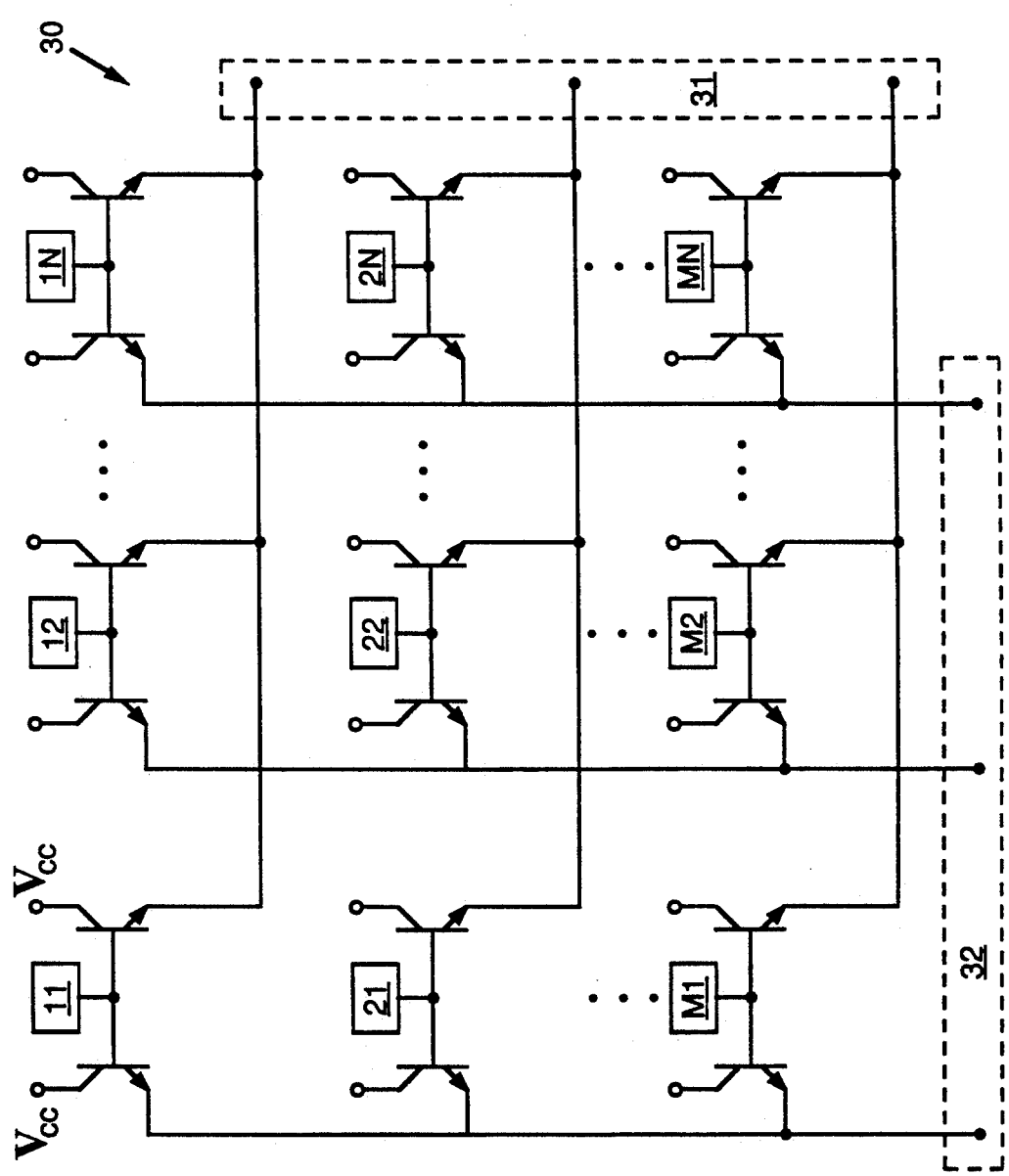
FIG. 3 is a schematic circuit diagram of a maximum intensity indicator/selector circuit of the present invention for an M×N array of photodetectors.

Max/min selector circuit 30 of FIG. 3 illustrates an M×N array of input circuits, such as photodetector circuits 11 through MN. Each photodetector input circuit is connected to a first input comparator 31 connected along a row and to a second input comparator 32 connected along a column. Comparator circuit 31 indicates which one of the M rows of circuit 30 has the photodetector circuit with the highest (or lowest) current. Likewise, comparator circuit 32 indicates which one of the N columns of circuit 30 has the photodetector circuit with the highest (or lowest) current. Thus, comparator circuits 31 and 32 uniquely identify the photodetector circuit in the M×N array that has the highest (or lowest) output. This approach allows a great reduction in the number of inputs to the comparators, thereby simplifying hardware structure and improving resolution because of the fewer input nodes.

In the max/min indicator/selector circuit of the present invention, the total current flowing through the comparator stages is set by current source $I_{bias}$ and as independent of the number of inputs to the comparators. As stated above, the circuit can be implemented in either npn or pnp bipolar transistors or, to some extent, MOSFET technology. Furthermore, all transistors and diodes operate in their normal operation range in the present invention, as opposed to prior art winner-take-all schemes that use the sub-threshold bias regions of MOSFETs. As a result, no special control of device characteristics is needed during fabrication, thus providing good uniformity and yield.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. An electronic circuit, comprising:
    a first comparator stage having a plurality of emitter-coupled bipolar transistors for receiving a plurality of input signals, said signals having differences in strength;
    means for amplifying said input signals, thereby amplifying said differences in strength; and
    means for determining the one of said amplified input signals that has the greatest strength.

2. The electronic circuit of claim 1, wherein said amplifying means comprises an inverter-amplifier having a plurality of emitter-coupled bipolar transistors.

3. The electronic circuit of claim 1, wherein said determining means comprises a second comparator stage having a plurality of emitter-coupled bipolar transistors.

4. The electronic circuit of claim 3, wherein said amplifying means comprises an inverter-amplifier having a plurality of emitter-coupled transistors connected between said first comparator stage of emitter-coupled transistors and said second comparator stage of emitter-coupled transistors.

5. An electronic signal comparator circuit, comprising:
    a plurality of substantially identical input circuits for providing a corresponding plurality of input signals to the comparator circuit, each of said input circuits comprising:
a current source generating an input current;
means for converting said input current to a voltage proportional to the log of said input current; and
means for buffering said voltage to selectively provide an input signal that is high when said input current is high or an input signal that is high when said input current is low;
comparator means for receiving said plurality of input signals, said input signals having differences in strength; and
means for determining the one of said input signals that has the greatest strength.

6. The electronic circuit of claim 5, wherein said comparator means comprises a first comparator stage having a plurality of emitter-coupled bipolar transistors for receiving said plurality of input signals.

7. The electronic circuit of claim 6, wherein said comparator means further comprises an inverter-amplifier connected to said first comparator stage.

8. The electronic circuit of claim 7, wherein said determining means comprises a second comparator stage having a plurality of emitter-coupled bipolar transistors connected to said inverter-amplifier.

9. The electronic circuit of claim 5, wherein said current source of said input circuit comprises a photodetector for generating said input current.

10. The electronic circuit of claim 9, wherein said converting means of said input circuit comprises an amplifier and at least one diode for generating said voltage proportional to the log of said input current generated by said photodetector.

11. The electronic circuit of claim 10, wherein said buffering means of said input circuit comprises a transistor having a base connected to receive said voltage proportional to the log of said input current, a collector connected to a node for providing said input signal that is high when said input current is high, and an emitter connected to a node for providing said input signal that is high when said input current is low.

12. The electronic circuit of claim 8, wherein each of said transistors of said second comparator stage is connected to a means for indicating said one of said input signals that has the greatest strength.

13. The electronic circuit of claim 11, wherein each of said indicating means further comprises means for selecting said one of said input signals that has the greatest strength.

14. An electronic signal comparator circuit, comprising:
a plurality of substantially identical input circuits for providing a corresponding plurality of input signals to the comparator circuit, each of said input circuits comprising:
a current source generating an input current;
means for converting said input current to a voltage proportional to the log of said input current; and
means for buffering said voltage to selectively provide an input signal that is high when said input current is high or an input signal that is high when said input current is low;
a first comparator stage having a plurality of emitter-coupled transistors for receiving said plurality of input signals, said input signals having differences in strength;
an inverter-amplifier connected to said first comparator stage; and
a second comparator stage having a plurality of emitter-coupled transistors connected to said inverter-amplifier for determining the one of said input signals that has the greatest strength.

15. The electronic circuit of claim 14, wherein said current source of said input circuit comprises a photodetector for generating said input current.

16. The electronic circuit of claim 15, wherein said converting means of said input circuit comprises an amplifier and at least one diode for generating said voltage proportional to the log of said input current generated by said photodetector.

17. The electronic circuit of claim 16, wherein said buffering means of said input circuit comprises a transistor having a base connected to receive said voltage proportional to the log of said input current, a collector connected to a node for providing said input signal that is high when said input current is high, and an emitter connected to a node for providing said input signal that is high when said input current is low.

18. The electronic circuit of claim 17, wherein each of said transistors of said second comparator stage is connected to a means for indicating which of said input signals has the greatest strength.

19. The electronic circuit of claim 18, wherein each of said indicating means further comprises means for selecting said input signal having the greatest strength.

* * * * *